US008378501B2

(12) United States Patent
Yamada et al.

(10) Patent No.: US 8,378,501 B2
(45) Date of Patent: Feb. 19, 2013

(54) SEMICONDUCTOR PACKAGE AND SEMICONDUCTOR PACKAGE MODULE

(75) Inventors: Kosuke Yamada, Nagaokakyo (JP); Noboru Kato, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 174 days.

(21) Appl. No.: 12/833,083

(22) Filed: Jul. 9, 2010

(65) Prior Publication Data

US 2011/0018130 A1 Jan. 27, 2011

(30) Foreign Application Priority Data

Jul. 24, 2009 (JP) ................................ 2009-173073

(51) Int. Cl.
*H01L 23/48* (2006.01)
*H01L 23/52* (2006.01)

(52) U.S. Cl. ........ 257/778; 257/723; 257/737; 257/738; 257/788; 257/E21.503; 257/E21.511; 257/E23.021; 257/E23.069; 438/107; 438/108; 438/118

(58) Field of Classification Search .................. 257/723, 257/737, 739, 778, 788, E21.503, E21.511, 257/E23.021, E23.069; 438/107, 108, 118
See application file for complete search history.

(56) References Cited

U.S. PATENT DOCUMENTS

| 5,121,190 A | | 6/1992 | Hsiao et al. | |
|---|---|---|---|---|
| 5,598,036 A | * | 1/1997 | Ho ............................... | 257/738 |
| 5,869,904 A | | 2/1999 | Shoji | |
| 6,737,295 B2 | * | 5/2004 | Pendse et al. ................. | 438/106 |
| 6,825,568 B2 | * | 11/2004 | Hung ............................. | 257/778 |
| 8,274,158 B2 | * | 9/2012 | Kasai et al. ................... | 257/778 |
| 2002/0100610 A1 | * | 8/2002 | Yasuda et al. ................. | 174/260 |
| 2005/0104222 A1 | * | 5/2005 | Jeong et al. ................... | 257/778 |
| 2007/0200229 A1 | * | 8/2007 | Daubenspeck et al. ....... | 257/723 |
| 2010/0140800 A1 | * | 6/2010 | Hagihara ...................... | 257/737 |

FOREIGN PATENT DOCUMENTS

| JP | 11-274374 A | 10/1999 |
|---|---|---|
| JP | 2002-270643 A | 9/2002 |
| JP | 2005-217264 A | 8/2005 |
| JP | 2008-227355 A | 9/2008 |

OTHER PUBLICATIONS

Official Communication issued in corresponding Japanese Patent Application No. 2009-173073, mailed on Nov. 8, 2011.

* cited by examiner

*Primary Examiner* — Dao H Nguyen
(74) *Attorney, Agent, or Firm* — Keating & Bennett, LLP (57) ABSTRACT

A semiconductor package is provided with a functionally necessary minimum number of components with which stress concentrated on specific solder bumps is reduced and ruptures of the bumps are prevented even when stress caused by physical bending or a difference in thermal expansion coefficient is applied to the package. The semiconductor package includes a tabular die and bonding pads arranged on a mounting surface of the die. A passivation layer and a protective film are provided on the mounting surface such that central areas of the bonding pads are open. Under-bump metals (UBMs) connected to the bonding pads are provided in the openings, and solder bumps are provided on the surfaces of the UBMs. The diameter of the UBMs provided at corners of the die is less than that of the UBM provided at the approximate center of the die so that the elastic modulus of the UBMs provided at the corners is small.

13 Claims, 7 Drawing Sheets

FIG. 1A

FIG. 1B $\phi c > \phi e$

$\phi c > \phi e$

FIG. 5B $\phi c > \phi s \geqq \phi e$

FIG. 6

$\phi c > \phi n1 > \phi n2 > \phi n3$

SEMICONDUCTOR PACKAGE AND SEMICONDUCTOR PACKAGE MODULE

BACKGROUND OF THE INVENTION

1. Field of the Invention

The present invention relates to semiconductor packages including dies of semiconductor chips that are flip-chip mounted on circuit boards, and to semiconductor package modules including the semiconductor packages and the circuit boards.

2. Description of the Related Art

At present, chip scale package (CSP) modules including dies of semiconductor chips and circuit boards on which the dies are flip-chip mounted have been in use in various fields.

As Japanese Unexamined Patent Application Publication No. 11-274374 describes, semiconductor package modules such as the CSP modules, include a die (wafer) having bonding pads arranged on a main surface thereof and a passivation layer arranged so as to expose the bonding pads therethrough. Furthermore, a protective film made of, for example, polyimide is provided on the surface of the passivation layer. In addition, an under-bump metal (UBM) is provided on each bonding pad so as to connect the bonding pads arranged adjacent to the die rather than to the passivation layer and the protective film to an external circuit board, and solder bumps are provided on the surfaces of the UBMs.

Figure 7A:
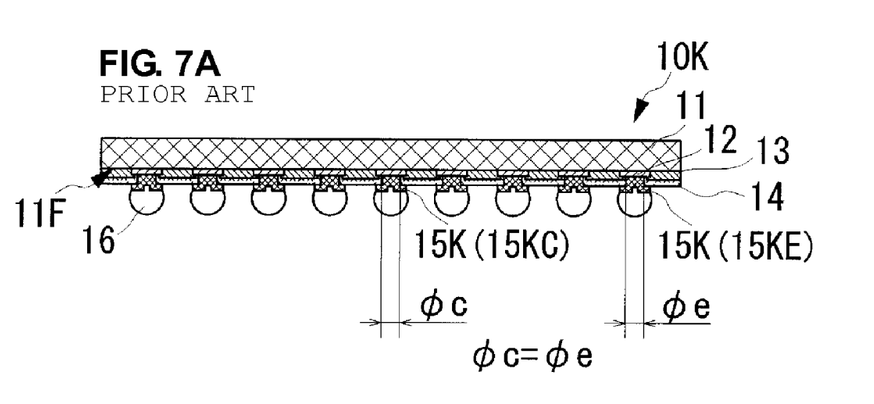
FIG. 7A illustrates a known CSP package, and FIG. 7B illustrate a known CSP package module in more detail.
Figure 7B:
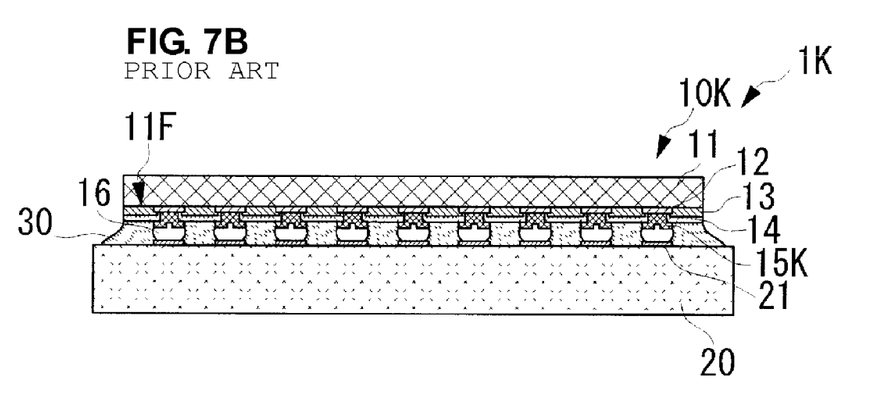

FIG. 7A is a cross-sectional view illustrating the structure of a known semiconductor package 10K used for the semiconductor package module 1K, and FIG. 7B is a cross-sectional view illustrating the structure of a known semiconductor package module 1K. In FIGS. 7A and 7B, lands and solder bumps used for mounting the semiconductor package module 1K to an external circuit board are not illustrated.

As shown in FIG. 7A, the known semiconductor package 10K includes a semiconductor IC die 11, and bonding pads 12 are two-dimensionally arranged on a mounting surface 11F of the die 11. A passivation layer 13 is provided on the mounting surface 11F of the die 11 such that a central area of each bonding pad 12 is open. Furthermore, a protective film 14 is provided so as to cover the passivation layer 13 such that the central area of each bonding pad 12 is exposed therethrough.

A UBM 15K is provided on the surface of each bonding pad 12 so as to be exposed over the surface of the protective film 14 adjacent to the outside.

Presently, all of the UBMs 15K usually have the same diameter. That is, the diameter $\phi c$ of the UBM 15KC at the center of the die 11 and the diameter $\phi e$ of the UBM 15KE at an end of the die 11 are the same. Herein, the diameter of the UBMs refers to that of the UBMs 15K when viewed in a direction perpendicular to the mounting surface 11F of the die 11. More specifically, it refers to the diameter of portions enclosed by the protective film 14 connected to the bonding pads 12.

In addition, solder bumps 16 are provided on the surfaces of the UBMs 15K having the same shape as described above.

The semiconductor package 10K is flip-chip mounted on a circuit board 20. That is, the semiconductor package 10K is arranged such that the mounting surface 11F thereof faces the circuit board 20 and such that the solder bumps 16 face corresponding mounting lands 21 of the circuit board 20. Subsequently, a reflow process, for example, is performed so that the UBMs 15K of the semiconductor package 10K and the mounting lands 21 of the circuit board 20 are electrically connected by the solder bumps 16.

In the above-described known structure, the positional relationship between the bonding pads 12 (UBMs 15K) of the semiconductor package 10K and the mounting lands 21 of the circuit board 20 may change due to differences in the thermal expansion coefficient between the circuit board 20 and the die 11, and the solder bumps 16 may rupture due to the stress caused by the change in the positional relationship.

Moreover, when stress, such as bending stress, is applied from the outside to the CSP module 1K, the positional relationship between the bonding pads 12 (UBMs 15K) of the semiconductor package 10K and the mounting lands 21 of the circuit board 20 may change due to differences in the degree of bending between the circuit board 20 and the die 11, and the solder bumps 16 may rupture due to the stress caused by the change in the positional relationship.

In the known structure, a resin seal 30 that reduces stress occurring in the connecting structure between the semiconductor package 10K and the circuit board 20 is arranged so as to cover the connecting portions using the solder bumps 16, and prevents the rupture of the solder bumps 16.

However, in the above-described known structure, resin sealing, which is not directly related to functional connection (mounting), is required after the functional connection, and causes an increase in workload accordingly. It also requires resin which is an additional constituent material. Therefore, the semiconductor package module becomes expensive due to components that are not directly required for functional needs.

SUMMARY OF THE INVENTION

To overcome the problems described above, preferred embodiments of the present invention provide a highly reliable semiconductor package and a highly reliable semiconductor package module with a functionally necessary minimum structure with which ruptures of solder bumps caused by a difference in the thermal expansion coefficient between a die of the semiconductor package and a circuit board and ruptures of solder bumps caused by external stress are prevented.

According to a first preferred embodiment of the present invention, a semiconductor package includes a tabular semiconductor die including a predetermined electronic circuit provided thereon, a plurality of bonding pads arranged on a mounting surface of the die, and under-bump metals (UBMs) provided on the surfaces of the corresponding bonding pads and extending perpendicular or substantially perpendicular to the surfaces. The elastic modulus of the UBMs provided on the bonding pads at corners of the die is less than that of the UBM provided on the bonding pad substantially at the center of the die.

According to a second preferred embodiment of the present invention, a semiconductor package includes a tabular semiconductor die including a predetermined electronic circuit provided thereon, a plurality of bonding pads arranged on a mounting surface of the die, and UBMs provided on the surfaces of the corresponding bonding pads and extending perpendicular or substantially perpendicular to the surfaces. The elastic modulus of the UBMs provided on the bonding pads at peripheral portions of the die is less than that of the UBM provided on the bonding pad substantially at the center of the die.

The above-described structures are provided based on the fact that solder bumps at the corners or the peripheral portions of the die of the semiconductor package are more easily affected and damaged by stress from the outside as compared to the solder bump substantially at the center when a semiconductor package module, including the semiconductor package connected to a circuit board using the solder bumps provided on the UBMs, is subjected to stress from the outside.

The elastic modulus of the UBMs at the corners or the peripheral portions of the die of the semiconductor package is reduced as compared to that of the UBM substantially at the center of the die. With this configuration, the UBMs at the corners or the peripheral portions, which are more susceptible to stress, can be deformed more easily when subjected to stress from the outside. Stress applied from the outside to the solder bumps at the corners or the peripheral portions is reduced since the stress is uniformly distributed to the solder bumps by the deformation of the UBMs. Consequently, stress applied to the solder bumps is reduced and ruptures of the solder bumps are prevented without using resin sealing as in the related art.

Moreover, the diameter of the UBMs with a reduced elastic modulus is preferably less than that of the UBM provided on the bonding pad substantially at the center of the die.

With this structure, the diameter of the UBMs at the corners or the peripheral portions is reduced as compared to that of the UBM substantially at the center due to the fact that the elastic modulus of the UBMs depend on the area with which the UBMs and the bonding pads are connected, that is, the diameters of the UBMs. With this configuration, the elastic modulus of the UBMs at the corners or the peripheral portions is reduced. In this manner, UBMs with a low elastic modulus can be provided with a simple and easy structure.

Moreover, the UBMs preferably each include a first portion connected to a corresponding bonding pad and a second portion, provided at an end of the first portion, on which a solder bump is provided. The diameter of the first portions of the UBMs with a reduced elastic modulus is preferably less than the diameter of the first portion of the UBM provided on the bonding pad substantially at the center of the die.

Each of the UBMs includes the first portion connected to the corresponding bonding pad and the second portion on which the corresponding solder bump is provided. In addition, the diameter of the first portions is reduced so that the elastic modulus is reduced. With this configuration, the elastic modulus can be reduced without reducing the size of the solder bumps. Moreover, stress can be reduced more easily since the first portions are longer than the second portions in a direction perpendicular or substantially perpendicular to the surfaces of the bonding pads. In this manner, UBMs that can reduce stress more effectively can be provided.

Moreover, the semiconductor package preferably further includes a protective film having a predetermined elasticity that partially covers the bonding pads and encloses the first portions of the UBMs.

The protective film with a predetermined elasticity is arranged so as to enclose the first portions of the UBMs. With this structure, the stress relieving ability is further improved.

According to a third preferred embodiment of the present invention, a semiconductor package includes a tabular semiconductor die including a predetermined electronic circuit provided thereon, a plurality of bonding pads arranged on a mounting surface of the die, and UBMs provided on the surfaces of the corresponding bonding pads and extending perpendicular or substantially perpendicular to the surfaces. The elastic modulus of the UBMs provided on the bonding pads are reduced as the distances from the UBM provided on the bonding pad substantially at the center of the die are increased.

With this structure, the elastic modulus of the UBMs are reduced as the distance from the substantial center of the die increases. This is due to the fact that the UBMs become more susceptible to stress as they get closer to the corners and peripheral portions of the die away from the substantial center. With the above-described structure, stress can be reduced as appropriate at each of the UBMs provided on the bonding pads of the die not only at the corners and the peripheral portions. As a result, reduced and substantially uniform stress is applied to all of the UBMs, and ruptures of the solder bumps can be effectively prevented over the entire area of the semiconductor package.

Moreover, the diameters of the UBMs provided on the bonding pads are preferably reduced as the distance from the UBM provided on the bonding pad substantially at the center of the die increases.

This structure is an example of how to set the elastic modulus, that is, the diameters of the UBMs are reduced as the distance from the substantial center of the die increases. With this simple and easy structure, the elastic modulus can be set in accordance with the distances from the substantial center of the die.

According to a fourth preferred embodiment of the present invention, a semiconductor package module includes one of the above-described semiconductor packages and a circuit board including mounting lands provided at positions facing the solder bumps of the semiconductor package. The UBMs are connected to the corresponding mounting lands via the respective solder bumps.

This semiconductor package module including the semiconductor package with the above-described structures can prevent ruptures of the solder bumps, and thus is highly reliable.

According to various preferred embodiments of the present invention, ruptures of solder bumps can be prevented by relieving stress concentrated on specific solder bumps while using only a minimum amount of components that are functionally required as a semiconductor package module even when stress caused by, for example, physical bending or a difference in thermal expansion coefficient, is applied to a semiconductor package module. With this configuration, a highly reliable semiconductor package and a highly reliable semiconductor package module can be provided with a simple structure at low cost.

The above and other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

A semiconductor package module and a semiconductor package included in the semiconductor package module according to a first preferred embodiment of the present invention will now be described with reference to FIGS. 1A to 4B.

A semiconductor package 10 according to this preferred embodiment preferably is substantially square when viewed in plan view, and includes a semiconductor die 11 having a predetermined thickness. The die 11 includes desired electronic circuit elements and electronic circuit patterns provided thereon in advance, and includes a plurality of bonding pads 12 provided on a mounting surface 11F thereof.

The plurality of bonding pads 12 are preferably arranged in a two-dimensional pattern over the entire or substantially the entire mounting surface 11F of the die 11. In FIGS. 1A and 1B and 2A to 2C, for example, 9×9 bonding pads 12 are preferably formed on the mounting surface 11F of the die 11 at substantially regular intervals. Herein, the number of the bonding pads 12 is not particularly limited, and can be changed as appropriate in accordance with the specifications.

A passivation layer 13 is provided on the mounting surface 11F of the die 11. The passivation layer 13 includes openings at the central portion of the bonding pads 12. The passivation layer 13, preferably made of an insulating material, such as polyimide, for example, is provided on the entire or substantially the entire mounting surface 11F using a method such as chemical-vapor deposition, for example, and is patterned so as to include the above-described openings.

Furthermore, a protective film 14 is preferably arranged so as to cover the passivation layer 13 on the mounting surface 11F of the die 11. At this moment, the protective film 14 includes openings at the central areas of the bonding pads 12, on which under-bump metals (UBMs) 15 are to be provided, while covering the passivation layer 13. Moreover, the protective film is preferably made of an insulating material having a predetermined elasticity, for example, polyimide. The protective film 14 is provided on the entire or substantially the entire mounting surface 11F, and is patterned so as to include openings corresponding to the openings in the passivation layer 13.

The UBMs 15 are arranged in the areas of the above-described openings for the bonding pads 12. The UBMs 15 are preferably made of a plurality of different metals, for example. The UBM may preferably be a compound of Cr and Cu or a Ni/Au laminated film, for example.

Each of the UBMs 15 includes a neck 151 and a head 152 that are integrated with each other. The necks 151 of the UBMs are connected to the bonding pads 12, and extend in a direction perpendicular or substantially perpendicular to the surfaces of the bonding pads 12. In addition, the necks are surrounded by the protective film 14. The heads 152 of the UBMs 15 are provided at ends of the necks 151 opposite to the bonding pads 12, and are exposed over the surface of the protective film 14. Furthermore, the areas of the heads 152 when viewed in plan view are greater than those of the necks 151, that is, the diameters of the heads 152 when viewed in plan view are greater than those of the necks 151, and the thicknesses thereof are less than those of the necks 151.

In addition, the necks 151 of the UBMs 15 have different diameters when viewed in plan view depending upon the positions of the respective UBMs 15 on the die 11 while all the heads 152 of the UBMs 15 have the same structure regardless of the positions on the die 11. More specifically, in the semiconductor package 10 according to this preferred embodiment, the diameter of UBMs 15E provided at corners of the die 11 is less than that of a UBM 15C provided at the approximate center of the die 11. That is, the diameter $\phi c$ of the UBM 15C at the approximate center of the die 11 and the diameter $\phi e$ of the UBMs 15E at the corners of the die 11 have a relationship of $\phi c > \phi e$. Moreover, the UBMs 15 other than the UBMs 15E at the corners of the die 11 have the same or substantially the same diameter as that of the UBM 15C at the center.

Herein, the elastic modulus k of a UBM 15 is defined as $k=f(\alpha, S/L)$. In this expression, $f(*)$ represents a function of $*$, $\alpha$ is a factor based on the material of the UBM 15, S is a value in proportion to an area with which the UBM 15 and the bonding pads 12 are connected, that is, the square of the diameter, and L is the length of the UBM 15 (length perpendicular or substantially perpendicular to the surface of the corresponding bonding pad 12). That is, the elastic modulus k is reduced as the diameter is reduced or as the length is increased when the material of the UBM 15 is the same.

Therefore, the elastic modulus of the UBMs 15E at the corners of the die 11 can be reduced by reducing the diameter of the UBMs 15E as compared to that of the UBM 15C at the approximate center or that of the other UBMs 15. With this configuration, the UBMs 15E at the corners of the die 11 can more easily expand or contract in response to external stress as compared to the other UBMs 15.

The solder bumps 16 are provided on the surfaces of the heads 152 of the UBMs 15 having the above-described structure. The same or substantially the same solder bumps 16 can be provided on all of the UBMs 15 since the heads 152 of the UBMs 15E have the same shape as those of the other UBMs 15, although the diameter of the necks 151 of the UBMs 15E is less than that of the other UBMs 15. That is, all of the solder bumps can be connected to mounting lands 21 of a circuit board 20 (described below) with the same strength.

The semiconductor package 10 having the above-described structure is mounted on the circuit board 20 using the solder bumps 16. The circuit board 20 includes the mounting lands 21 arranged at positions corresponding to those of the solder bumps 16 of the semiconductor package 10. The semiconductor package 10 and the circuit board 20 are electrically and structurally connected by soldering the solder bumps 16 to the mounting lands 21, and define a semiconductor package module 1.

The semiconductor package module 1 including the semiconductor package 10 having the above-described structure has the following features.

First, an effect of preventing ruptures of the solder bumps 16 when external stress is applied to the semiconductor package module 1 will be described.

Figure 1A:
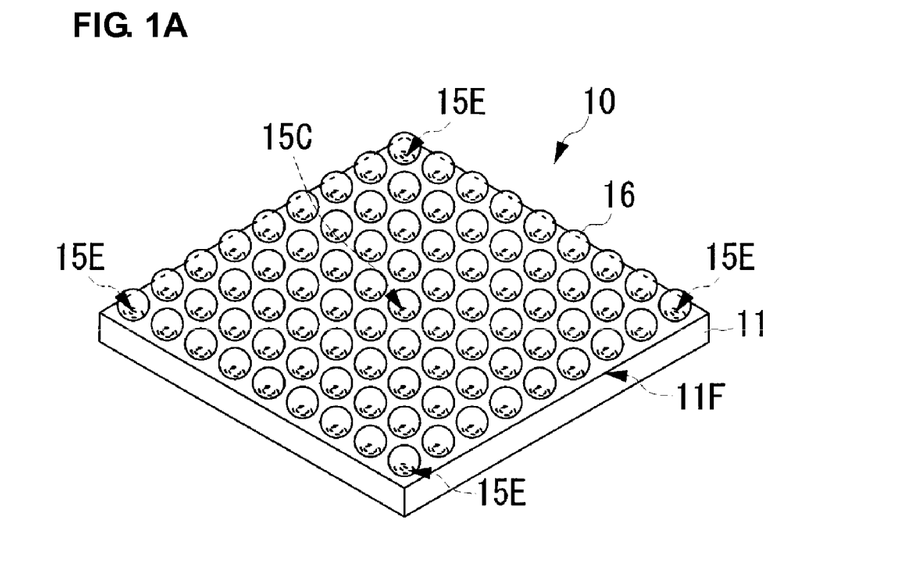
FIG. 1A is a schematic perspective view of a semiconductor package according to a first preferred embodiment of the present invention viewed from a side of a mounting surface of a die.
Figure 1B:
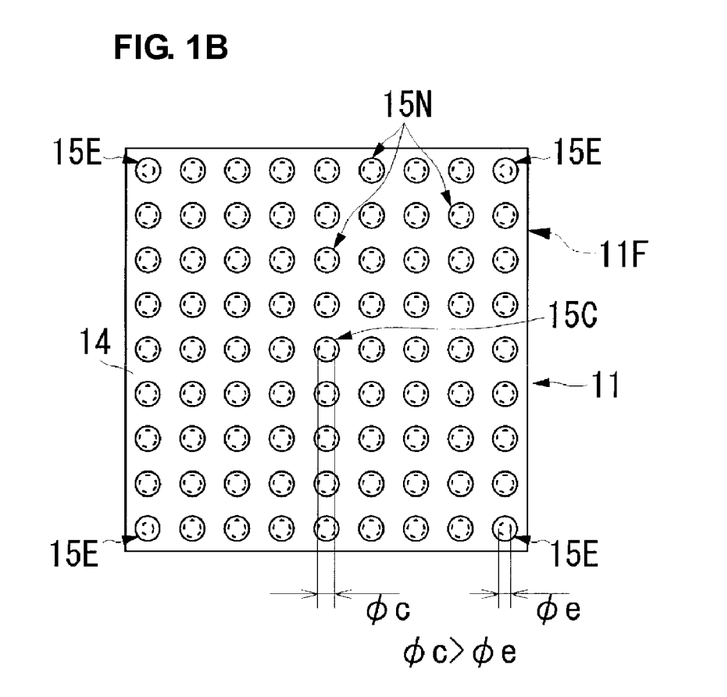
FIG. 1B is a plan view of the semiconductor package viewed from the side of the mounting surface of the die.
Figure 2A:
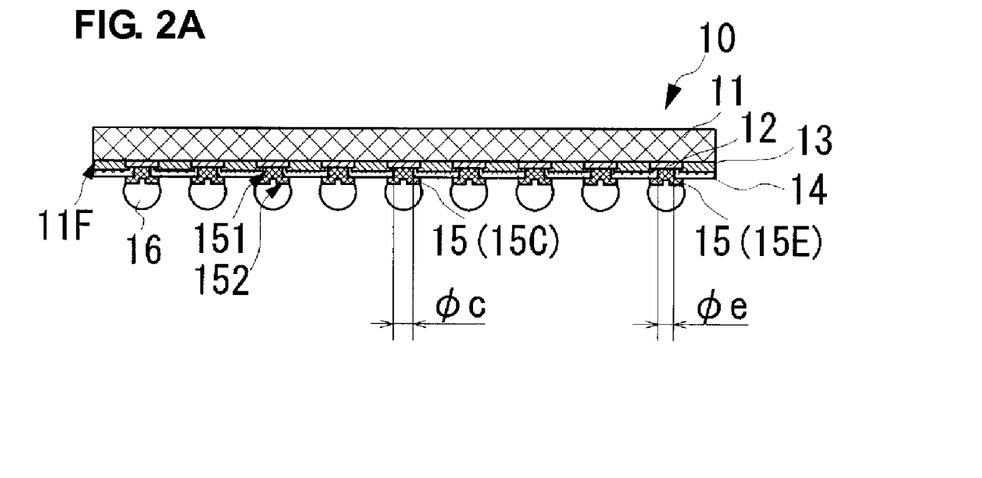
FIG. 2A is a cross-sectional view taken along a diagonal line of the semiconductor package according to the first preferred embodiment of the present invention.
Figure 2B:
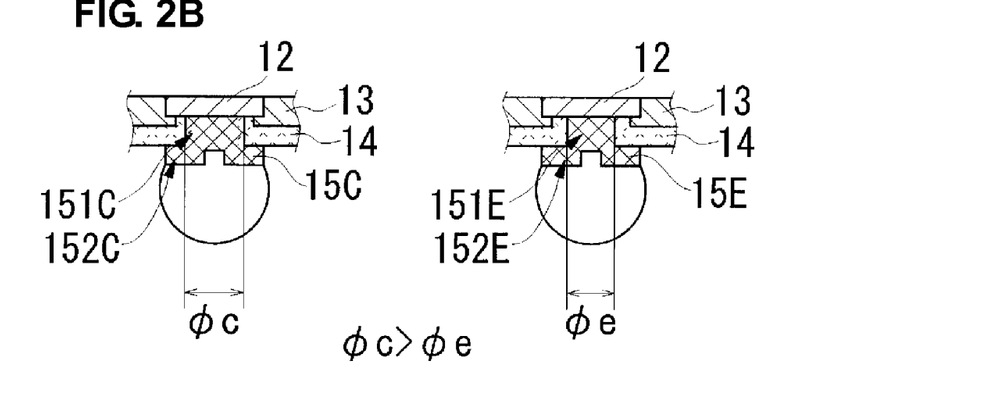
FIG. 2B is an enlarged cross-sectional view illustrating a UBM substantially at the center of the die and a UBM at a corner of the die.
Figure 2C:
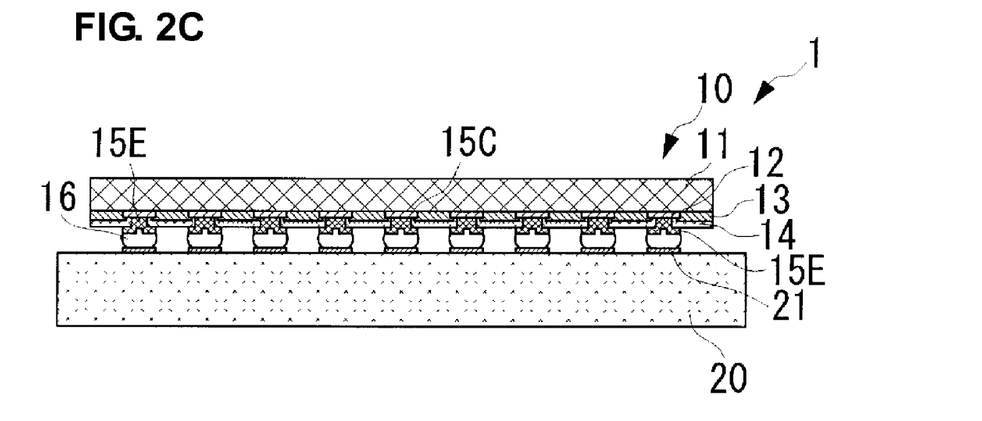
FIG. 2C is a cross-sectional view taken along a diagonal line of the semiconductor package module according to the first preferred embodiment of the present invention.
Figure 3A:
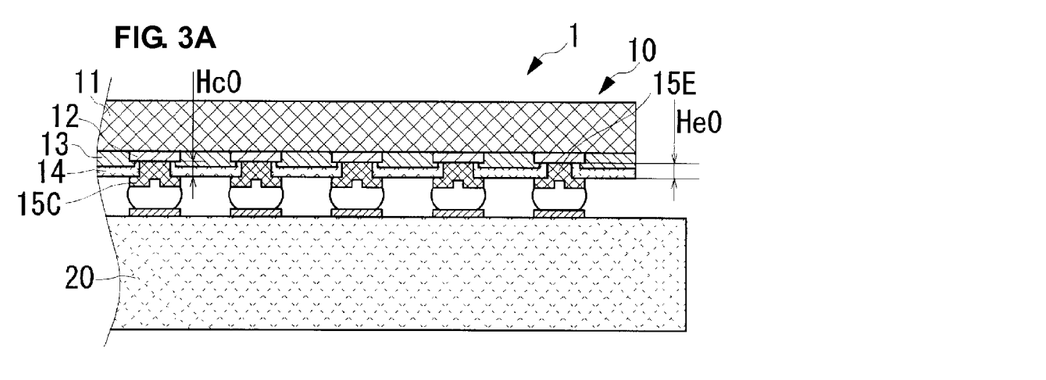
FIG. 3A to 3C are cross-sectional views schematically illustrating the behavior of the semiconductor package module according to the first preferred embodiment of the present invention when subjected to external stress caused by bending.
Figure 3B:
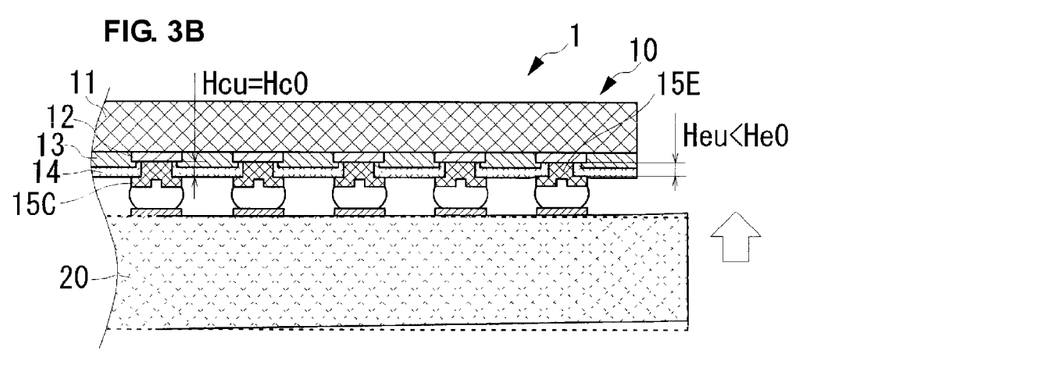
Figure 3C:
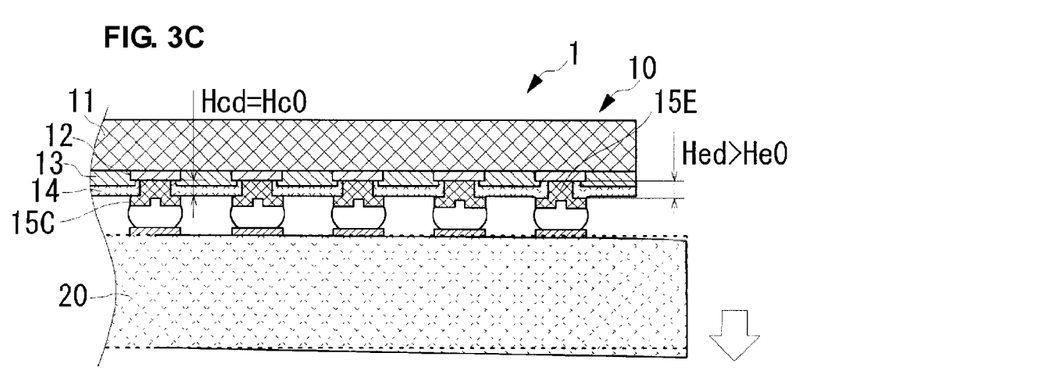

FIG. 3A to 3C are cross-sectional views schematically illustrating the behavior of the semiconductor package module 1 according to this preferred embodiment when subjected to external stress caused by bending. FIG. 3A illustrates a normal state when no stress is applied, FIG. 3B illustrates a state where the circuit board 20 is bent toward the semiconductor package 10, and FIG. 3C illustrates a state where the circuit board 20 is bent so as to be remote from the semiconductor package 10.

As shown in FIG. 3A, the height Hc0 of the UBM 15C at the center is equal or substantially equal to the height He0 of the UBMs 15E at the corners when no external stress is applied.

Next, as shown in FIG. 3B, the gap between the semiconductor package 10 and the circuit board 20 is reduced at the ends when the circuit board 20 is bent toward the semiconductor package 10 due to external stress although the gap between the semiconductor package 10 and the circuit board 20 does not substantially change at the approximate center thereof. In particular, the gap between the semiconductor package 10 and the circuit board 20 at the corners is more susceptible to warpage, and is further reduced.

In this condition, the height Hcu of the UBM 15C at the approximate center does not change from the height Hc0 of the UBM 15C in the normal state since the gap does not change at the approximate center, and substantially no stress is applied to the corresponding solder bump 16.

Although the gap changes at the corners, the height Heu of the UBMs 15E is reduced as compared to the height He0 of the UBMs 15E in the normal state (Heu<He0) in accordance with the gap since the elastic modulus of the UBMs 15E is relatively small. At this moment, the protective film 14 also deforms in accordance with the shape of the UBMs 15E since the protective film has a desired elasticity. In this manner, stress caused by warpage occurring at the connecting portions including the solder bumps 16 and the UBMs 15E acts on the deformation of the UBMs 15E and the deformation of the protective film 14, and stress applied to the solder bumps 16 at the corners is significantly reduced. With this configuration, stress concentration on the solder bumps 16 at the corners caused by the warpage is reduced, and ruptures of the solder bumps 16 at the corners are prevented.

Next, as shown in FIG. 3C, the gap between the semiconductor package 10 and the circuit board 20 is increased at the ends when the circuit board 20 is bent so as to be farther from the semiconductor package 10 due to external stress although the gap between the semiconductor package 10 and the circuit board 20 does not substantially change at the approximate center. In particular, the gap between the semiconductor package 10 and the circuit board 20 at the corners is more susceptible to the warpage, and is further increased.

In this condition, the height Hcd of the UBM 15C at the approximate center does not change from the height Hc0 of the UBM 15C in the normal state since the gap does not change at the approximate center, and substantially no stress is applied to the corresponding solder bump 16.

Although the gap changes at the corners, the height Hed of the UBMs 15E is increased as compared to the height He0 of the UBMs 15E in the normal state (Hed>He0) in accordance with the gap since the elastic modulus of the UBMs 15E is relatively small. At this moment, the protective film 14 also deforms in accordance with the shape of the UBMs 15E since the protective film has a desired elasticity. In this manner, stress caused by the warpage occurring at the connecting portions including the solder bumps 16 and the UBMs 15E acts on the deformation of the UBMs 15E and the deformation of the protective film 14, and stress applied to the solder bumps 16 is significantly reduced. With this configuration, ruptures of the solder bumps 16 caused by the warpage are prevented.

Next, the prevention of ruptures caused by a difference in the thermal expansion coefficient between die 11 of the semiconductor package 10 and the circuit board 20 will be described.

Figure 4A:
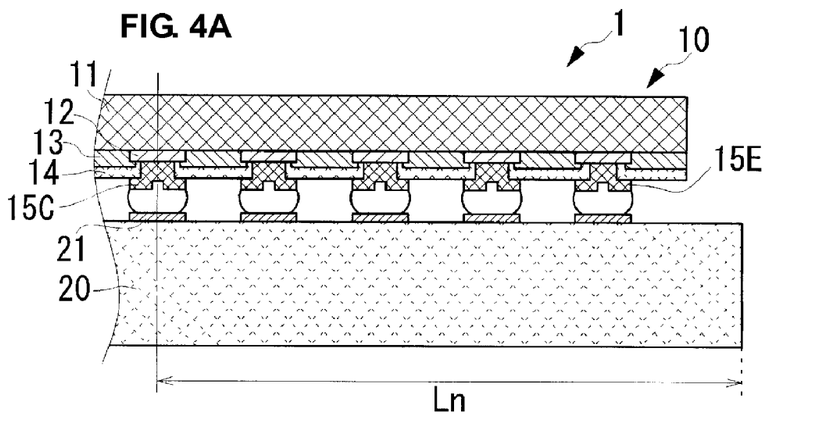
FIGS. 4A and 4B are cross-sectional views schematically illustrating the behavior of the semiconductor package module according to the first preferred embodiment of the present invention when subjected to intense heat.
Figure 4B:
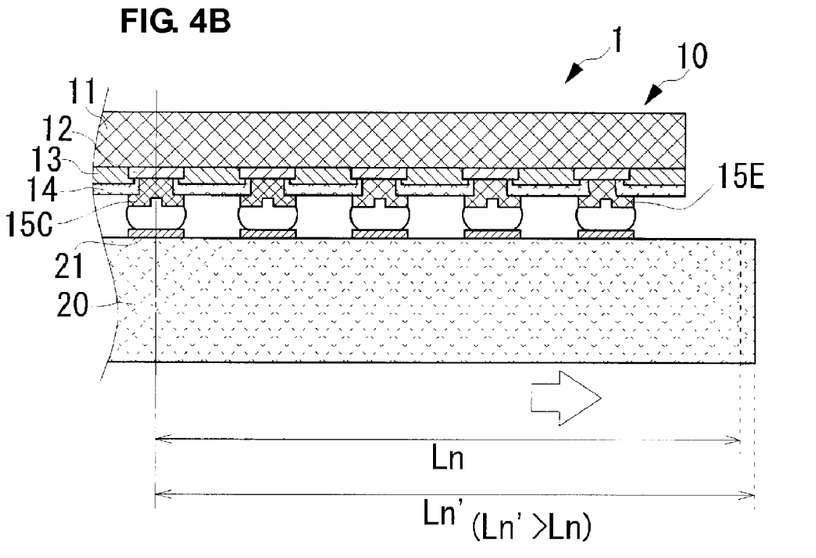

FIGS. 4A and 4B are cross-sectional views schematically illustrating the behavior of the semiconductor package module 1 according to this preferred embodiment when subjected to intense heat. FIG. 4A illustrates a state at a normal temperature (normal state) when the semiconductor package module is not subjected to intense heat, and FIG. 4B illustrates a state when the semiconductor package module is subjected to intense heat. In FIGS. 4A and 4B, Ln indicates a distance from the center of the UBM 15C at the approximate center of the die to a side surface of the circuit board 20 in a normal-temperature state, and Ln' indicates a distance from the center of the UBM 15C at the approximate center of the die to the side surface of the circuit board 20 when the semiconductor package module is subjected to intense heat.

As shown in FIG. 4A, when not subjected to intense heat, intervals between the UBMs 15 and those between the mounting lands 21 correspond to each other, and both the UBM 15C at the center and the UBMs 15E at the corners face the respective mounting lands 21 substantially at the same positions when viewed in elevation. Therefore, both the UBM 15C at the center and the UBMs 15E at the corners are not deformed, and are not subjected to stress.

Next, when the semiconductor package module 1 is subjected to intense heat, the circuit board 20 made of a dielectric material with a thermal expansion coefficient greater than that of the semiconductor die 11 extends more than the die 11 when viewed in elevation as shown in FIG. 4B. This causes inconsistencies in the intervals between the UBMs 15 and those between the mounting lands 21, and the positional relationship between the UBMs 15E and the corresponding mounting lands 21 when viewed in elevation is broken, in particular, at the corners, which are susceptible to the extension. However, since the UBMs 15E have a low elastic modulus, the UBMs can deform while extending in accordance with the displacement of the mounting lands 21. At this moment, the protective film 14 also deforms in accordance with the deformation of the UBMs 15E. That is, stress caused by the deformation due to the heat acts on the deformation of the UBMs 15E and the deformation of the protective film 14, and ruptures of the solder bumps 16 are prevented.

As described above, the solder bumps 16 can be prevented from rupturing by using the structure according to this preferred embodiment even when the circuit board 20 deforms due to external stress or heat applied to the semiconductor package module 1. Furthermore, the solder bumps 16 can be prevented from rupturing by using this structure since stress concentrated on the solder bumps 16 at the corners is reduced and is dispersed over the group of the solder bumps 16 provided on the entire semiconductor package module 1 so as to be averaged. At this moment, ruptures of the solder bumps 16 caused by the deformation are prevented by using only functionally necessary structures since no resin seal to reduce stress is required as in the related art.

Next, a semiconductor package module according to a second preferred embodiment of the present invention will be described with reference to the FIGS. 5A and 5B.

Figure 5A:
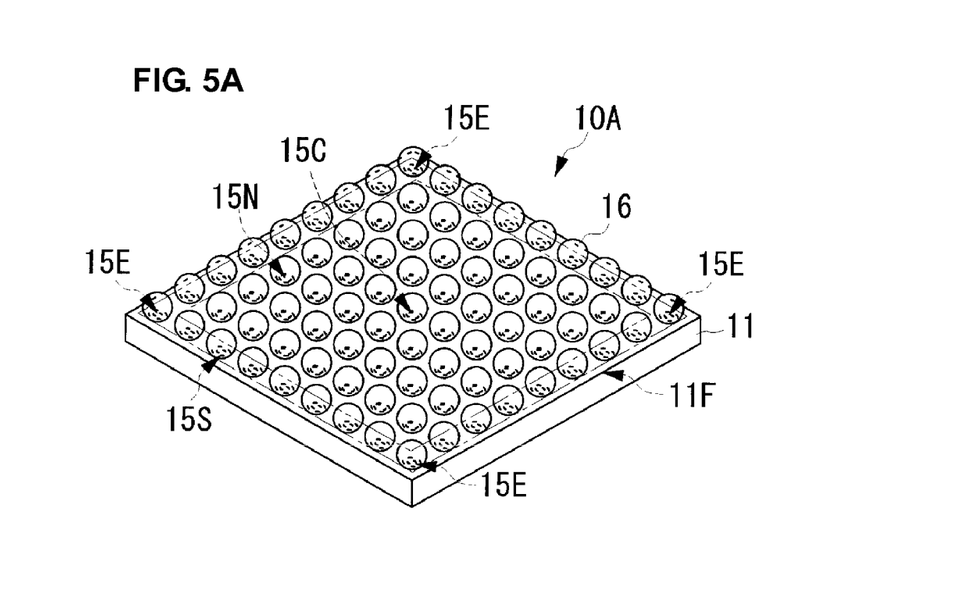
FIG. 5A is a schematic perspective view of a semiconductor package according to a second preferred embodiment of the present invention viewed from the side of the mounting surface of the die.
Figure 5B:
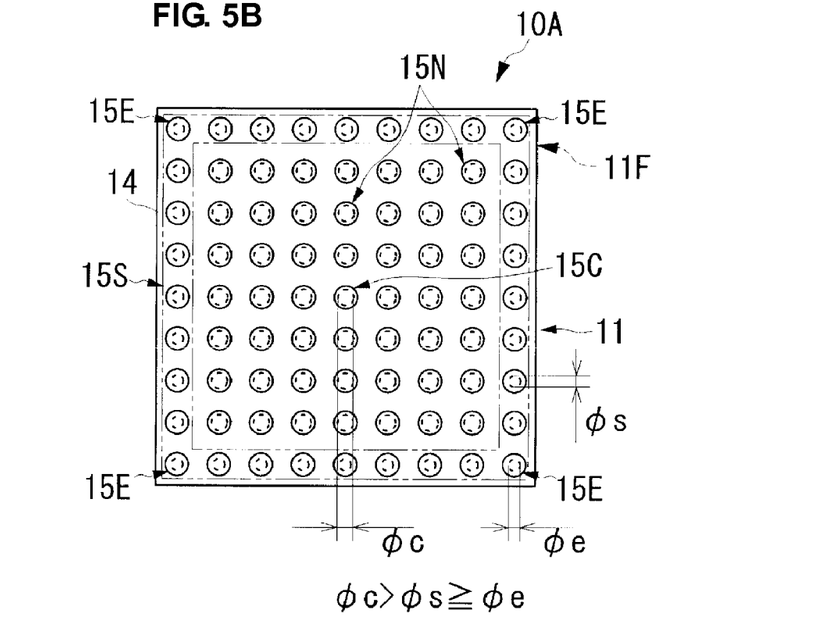
FIG. 5B is a plan view of the semiconductor package viewed from the side of the mounting surface of the die.

FIG. 5A is a schematic perspective view of a semiconductor package 10A according to this preferred embodiment viewed from the side of the mounting surface 11F of the die 11, and FIG. 5B is a plan view of the semiconductor package 10A viewed from the side of the mounting surface 11F of the die 11.

The semiconductor package 10A according to this preferred embodiment has the same or substantially the same structure as the semiconductor package 10 according to the first preferred embodiment except that the diameter φc of UBMs 15S at peripheral portions including the UBMs 15E at the corners is also reduced as compared to the diameter φc of the UBM 15C at the approximate center in addition to that of only the UBMs 15E at the corners. Herein, UBMs 15N except the UBMs 15S at the peripheral portions have the same structure as that of the UBM 15C at the approximate center.

The UBMs 15S at the peripheral portions refer to a group of the UBMs 15 at the outermost peripheries among the group of the UBMs 15 two-dimensionally arranged on the mounting surface 11F of the die 11, and refer to the group of the UBMs 15 provided along the sides of the die 11 at positions closest to the respective sides.

The group of the UBMs 15 located at positions adjacent to the sides of the die 11 and the solder bumps 16 provided thereon are also susceptible to external stress as are the UBMs 15E at the corners described in the first preferred embodiment. Therefore, the diameter of the UBMs 15S at the peripheral portions is reduced so that external stress applied to the connecting portions including the UBMs 15S at the peripheral portions is significantly reduced by expansion and contraction of the UBMs 15S at the peripheral portions. With this configuration, ruptures of the solder bumps 16 are prevented.

Although the diameters φs of all of the UBMs 15S at the peripheral portions are the same in this preferred embodiment, the diameters φe of the UBMs 15E at the corners may preferably be reduced as compared to the diameters φs of the UBMs 15S at the peripheral portions.

Next, a semiconductor package module according to a third preferred embodiment of the present invention will be described with reference to FIG. 6.

Figure 6:
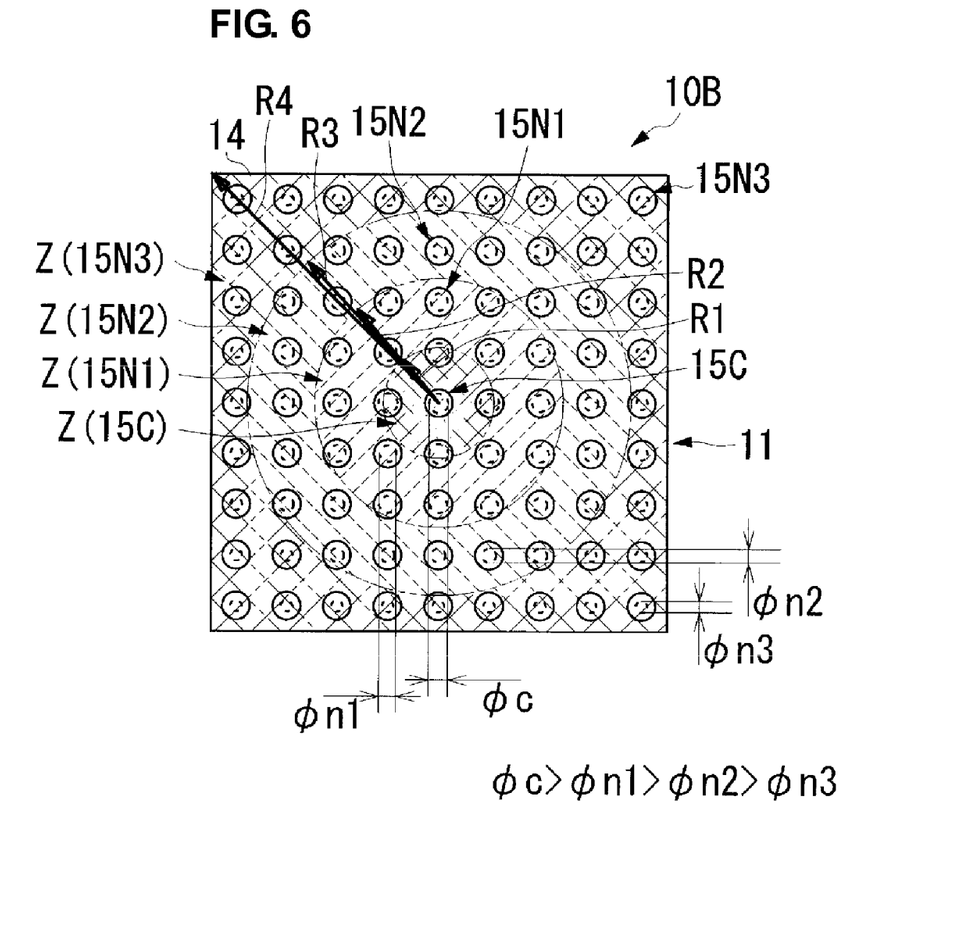
FIG. 6 is a plan view of a semiconductor package according to a third preferred embodiment of the present invention viewed from the side of the mounting surface of the die.

FIG. 6 is a plan view of a semiconductor package 10B according to this preferred embodiment viewed from the side of the mounting surface 11F of the die 11.

The semiconductor package 10B according to this preferred embodiment has the same or substantially the same structure as the semiconductor package 10 according to the first preferred embodiment except that the diameters of the UBMs 15 vary in accordance with their positions.

In the semiconductor package 10B according to this preferred embodiment, the two-dimensionally arranged UBMs 15 are sectioned into four areas Z(15C), Z(15N1), Z(15N2), and Z(15N3), each having a range of distances from the central UBM 15C, and the diameters of the UBMs 15 are set for each area.

First, UBMs 15 in the central area Z(15C) with a range of a distance R1 from the UBM 15C at the approximate center are have the same or substantially the same structure (diameter φc) as the UBM 15C at the approximate center. Next, UBMs 15N1 in the first intermediate area Z(15N1) with a range from the distance R1 to a distance R2 have a diameter φn1 less than the diameter φc of the UBM 15C at the approximate center. Next, UBMs 15N2 in the second intermediate area Z(15N2) with a range from the distance R2 to a distance R3 have a diameter φn2 less than the diameter φn1 of the UBMs 15N1 in the first intermediate area Z(15N1). Subsequently, UBMs 15N3 in the peripheral area Z(15N3) with a range from the distance R3 to a distance R4, defined by the distance to the corners, have a diameter φn3 less than the diameter φn2 of the UBMs 15N2 in the second area Z(15N2). That is, the UBMs 15 are configured such that the diameters φc, φn1, φn2, and φn3 in each area satisfy the following: φc>φn1>φn2>φn3. At this moment, the ratios of the diameter φn1 of the UBMs 15N1 in the first intermediate area Z(15N1), the diameter φn2 of the UBMs 15N2 in the second intermediate area Z(15N2), and the diameter φn3 of the UBMs 15N3 in the peripheral area Z(15N3) to the diameter φc of the UBM 15C in the central area Z(15C) can be set, for example, based on reciprocals of the ratios of the distances R2, R3, and R4 to the distance R1 from the approximate center.

With this structure, the elastic modulus of each UBM 15 is set in accordance with the distance from the approximate center, and the elastic modulus of the UBMs 15 are reduced as the distances from the approximate center to the areas increases. As a result, stress is reduced at positions closer to the peripheral portions and/or the corners, which are susceptible to stress, and ruptures of the solder bumps 16 are effectively prevented over the entire surface of the semiconductor package 10B.

Although the UBMs 15 are preferably sectioned into four areas in this preferred embodiment, the number of sections is not particularly limited. The UBMs can be sectioned into any suitable number of areas, and the diameters of the UBMs 15 can be set for each area. Furthermore, the diameter setting using the sectioned areas as described above and the diameter setting of the UBMs at the corners and the peripheral portions can be used at the same time. In addition, the diameter of each UBM 15 can be independently set in accordance with the distance from the approximate center.

Moreover, the semiconductor packages 10, 10A, and 10B in the above-described preferred embodiments include the UBMs arranged by (odd number)×(odd number) and the UBM 15C located at the approximate center of the die 11. However, the diameter of each UBM can be determined with reference to the approximate center of the die 11 or a UBM adjacent to the approximate center even when no UBM 15 is located at the true center of the die 11, for example, when at least one of the number of rows or the number of columns is even.

Although the elastic modulus of the UBMs are reduced by reducing the diameters of the UBMs in the above-described preferred embodiments, the elastic modulus may also be set by changing the material of each UBM or by changing the length of each UBM insofar as the connection is not adversely affected.

Although the protective film is also used to reduce the stress in the above-described preferred embodiments, stress may be reduced using only the necks of the UBMs without using the protective film.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor package comprising:
   a tabular semiconductor die including an electronic circuit provided thereon;
   a plurality of bonding pads arranged on a mounting surface of the die; and
   under-bump metals provided on surfaces of respective bonding pads of the plurality of bonding pads and extending perpendicular or substantially perpendicular to the surfaces of the respective bonding pads; wherein
   each of the under-bump metals includes a neck and a head;
   the neck is connected to a respective one of the plurality of bonding pads;

the head is provided at an end of the neck opposite to the respective one of the plurality of bonding pads;

a diameter of the neck is less than a diameter of the head; and the diameter of the neck of the under-bump metals provided on bonding pads of the plurality of bonding pads disposed at corners of the die is less than the diameter of the neck of the under-bump metal provided on a bonding pad of the plurality of bonding pads disposed substantially at a center of the die.

2. The semiconductor package according to claim 1, wherein an elastic modulus of the under-bump metals provided on the bonding pads disposed at corners of the die is less than an elastic modulus of the under-bump metal provided on the bonding pad disposed substantially at the center of the die.

3. The semiconductor package according to claim 1, wherein a solder bump is provided on the head of each of the under-bump metals.

4. A semiconductor package module comprising:

a semiconductor package according to claim 3; and a circuit board including mounting lands provided at positions facing the solder bumps of the semiconductor package; wherein the under-bump metals are connected to the corresponding mounting lands by the respective solder bumps.

5. The semiconductor package according to claim 1, further comprising:

a protective film having elasticity and being arranged to partially cover the plurality of bonding pads and enclose the necks of the under-bump metals.

6. A semiconductor package comprising:

a tabular semiconductor die including an electronic circuit provided thereon;

a plurality of bonding pads arranged on a mounting surface of the die; and under-bump metals provided on surfaces of respective bonding pads of the plurality of bonding pads and extending perpendicular or substantially perpendicular to the surfaces; wherein each of the under-bump metals includes a neck and a head;

the neck is connected to a respective one of the plurality of bonding pads;

the head is provided at an end of the neck opposite to the respective one of the plurality of bonding pads;

a diameter of the neck is less than a diameter of the head; and the diameter of the neck of the under-bump metals provided on bonding pads of the plurality of bonding pads disposed at peripheral portions of the die is less than the diameter of the neck of the under-bump metal provided on a bonding pad of the plurality of bonding pads disposed substantially at a center of the die.

7. The semiconductor package according to claim 6, wherein an elastic modulus of the under-bump metals provided on the bonding pads disposed at corners of the die is less than an elastic modulus the under-bump metal provided on the bonding pad disposed substantially at the center of the die.

8. The semiconductor package according to claim 6, wherein a solder bump is provided on the head of each of the under-bump metals.

9. A semiconductor package module comprising:

a semiconductor package according to claim 8; and a circuit board including mounting lands provided at positions facing the solder bumps of the semiconductor package; wherein the under-bump metals are connected to the corresponding mounting lands by the respective solder bumps.

10. The semiconductor package according to claim 6, further comprising:

a protective film having elasticity and being arranged to partially cover the plurality of bonding pads and to enclose the necks of the under-bump metals.

11. A semiconductor package comprising:

a tabular semiconductor die including a electronic circuit provided thereon;

a plurality of bonding pads arranged on a mounting surface of the die; and under-bump metals provided on surfaces of respective bonding pads of the plurality of bonding pads and extending perpendicular or substantially perpendicular to the surfaces; wherein each of the under-bump metals includes a neck and a head;

the neck is connected to a respective one of the plurality of bonding pads;

the head is provided at an end of the neck opposite to the respective one of the plurality of bonding pads;

a diameter of the neck is less than a diameter of the head; and the diameter of the neck of the under-bump metals provided on the plurality of bonding pads is reduced as a distance from the under-bump metals provided on the plurality of bonding pads to the under-bump metal provided on a bonding pad of the plurality of bonding pads disposed substantially at a center of the die increases.

12. The semiconductor package according to claim 11, wherein an elastic modulus of the under-bump metals provided on the bonding pads is reduced as the distance from the under-bump metals provided on the bonding pads to the under-bump metal provided on the bonding pad substantially at the center of the die increases.

13. A semiconductor package module comprising:

a semiconductor package according to claim 11; and a circuit board including mounting lands provided at positions facing solder bumps provided on the head of each of the under-bump metals of the semiconductor package; wherein the under-bump metals are connected to the corresponding mounting lands by the respective solder bumps.

* * * * *